US012802726B2

(12) United States Patent
Han

(10) Patent No.: US 12,802,726 B2
(45) Date of Patent: Nov. 17, 2026

(54) DEVICE WITH IMPROVED DATA RECEIVING LOGIC USING MULTIPLE LATCHING AND METHOD THEREOF

(71) Applicant: SK hynix Inc., Icheon-si (KR)

(72) Inventor: Ju Hyeon Han, Icheon-si (KR)

(73) Assignee: SK hynix Inc., Icheon-si (KR)

(*) Notice: Subject to any disclaimer, the term of this patent is extended or adjusted under 35 U.S.C. 154(b) by 219 days.

(21) Appl. No.: 18/646,670

(22) Filed: Apr. 25, 2024

(65) Prior Publication Data

US 2025/0191627 A1 Jun. 12, 2025

(30) Foreign Application Priority Data

Dec. 12, 2023 (KR) ........................ 10-2023-0179533

(51) Int. Cl.
*G11C 7/10* (2006.01)
*G11C 7/22* (2006.01)

(52) U.S. Cl.
CPC .......... *G11C 7/1087* (2013.01); *G11C 7/1093* (2013.01); *G11C 7/222* (2013.01)

(58) Field of Classification Search
CPC ................................ G11C 7/1087; G11C 7/10
USPC ........................................................ 365/189.5
See application file for complete search history.

(56) References Cited

U.S. PATENT DOCUMENTS 7,755,402 B1 * 7/2010 Ku ....................... G11C 7/1093 327/12
10,176,862 B1 * 1/2019 Penney ............... G06F 11/1004
2004/0044919 A1 * 3/2004 Dabral .................. H04L 7/0012 713/400
2006/0245101 A1 * 11/2006 Do ....................... G11C 7/1066 360/48
2018/0054336 A1 * 2/2018 Hori ...................... H04L 7/0008

FOREIGN PATENT DOCUMENTS

KR 10-2009-0108312 A 10/2009
KR 10-2023-0073326 A 5/2023
WO 2009037770 A1 3/2009

OTHER PUBLICATIONS

EESR—Extended European Search Report, issued by European Patent Office, on May 14, 2025, for the European Patent Application No. 24212273.7.

* cited by examiner

*Primary Examiner* — Muna A Techane

(57) ABSTRACT

An electronic apparatus includes: a latch trigger generator configured to generate a plurality of latch triggers based on an input data strobe signal and a plurality of preset delay times; a data latch unit configured to latch a data line based on the plurality of latch triggers to generate a plurality of latched data; and a processor configured to set the plurality of delay times and determine reception data based on the plurality of latched data.

16 Claims, 12 Drawing Sheets

DEVICE WITH IMPROVED DATA RECEIVING LOGIC USING MULTIPLE LATCHING AND METHOD THEREOF

CROSS REFERENCE TO RELATED APPLICATION

The present application claims the benefit 35 U.S.C. § 119(a) of Korea Patent Application No. 10-2023-0179533, filed Dec. 12, 2023 in the Korean Intellectual Property Office, the content of which is incorporated herein for all purposes by reference in its entirety.

FIELD

Various embodiments of the present disclosure relate to a method for improving reception performance during data transmission between entities.

BACKGROUND

An electronic apparatus is an apparatus configured to perform an operation while a plurality of chips or a plurality of cores exchange information with one another.

A storage device is a device capable of storing data at the request of a computer, a mobile terminal such as a smartphone and a tablet, or other external device, and may include a plurality of memory cores, or dies and a memory controller.

For example, the memory controller and the plurality of memories of the storage device may transmit control information and data to store them in the memory, or to read data from the memory.

In addition, the memory controller receives a command input from an external device, and may perform or control operations of reading data from the memory based on the input command, writing/programming data into the memory, or erasing data of the memory. That is, the external device and the memory controller may perform an operation while sending and receiving information (commands and messages transmitted in response to the commands) to and from each other.

A rule used for transmitting information between entities, devices or apparatuses is referred to as a protocol, and many protocols have been proposed and used depending on kinds of chips, kinds of information to be transmitted, and a speed of the information transmission. In an embodiment, the memory controller and the memory may transmit information to each other based on the open NAND flash interface (ONFI) protocol.

However, a length of a physical trace by which the information being transmitted between the entities differs from one another, and a time when the information is output from each of the entities differs from one another as well. Therefore, an arrival time when the information to be transmitted arrives to a target entity may differ from one another in different entities. Therefore, if a timing of the target entity to read the received information is inaccurate, there may occur a chance of reading wrong data.

SUMMARY

An object of the various embodiments of the present disclosure is to provide a method for improving a reception performance by performing reading with respect to the received information for a plurality of times, in a state in which times at which information is received from a plurality of entities differ from one another per entity.

The technical problem to be solved by the present disclosure is not limited to the above-mentioned technical problem, and other technical problems that are not mentioned will be clearly understood by ordinarily-skilled persons in the art to which the present disclosure pertains from the following description.

An embodiment of the disclosure is an electronic apparatus, including: a latch trigger generator configured to generate a plurality of latch triggers based on an input data strobe signal and a plurality of preset delay times; a data latch unit configured to latch a data line based on the plurality of latch triggers to generate a plurality of latched data; and a processor configured to set the plurality of delay times and determine reception data based on the plurality of latched data.

Another embodiment of the disclosure is a storage device, including: a memory having at least one die; and a memory controller configured to set a plurality of delay times for the at least one die, generate a plurality of latch triggers based on the plurality of delay times and a data strobe signal input from the memory when reading data, generate a plurality of latched data by latching a data line connected to the at least one die based on the plurality of latch triggers, and determine reception data based on the plurality of latched data.

Another embodiment of the disclosure is an electronic apparatus, including: at least one second entity; and a first entity configured to transmit or receive data together with the at least one second entity, and the first entity may be configured to set a plurality of delay times for the at least one second entity, generate a plurality of latch triggers based on the plurality of delay times and a data strobe signal input from the at least one second entity when reading data, generate a plurality of latched data by latching a data line connected to the at least one second entity based on the plurality of latch triggers, and determine reception data based on the plurality of latched data.

According to various embodiments of the present disclosure, it is possible to improve a reception performance by reading information for a plurality of times whenever receiving each information.

DETAILED DESCRIPTION

Hereinafter, embodiments of the present disclosure will be described in detail with reference to accompanying drawings.

Figure 1:
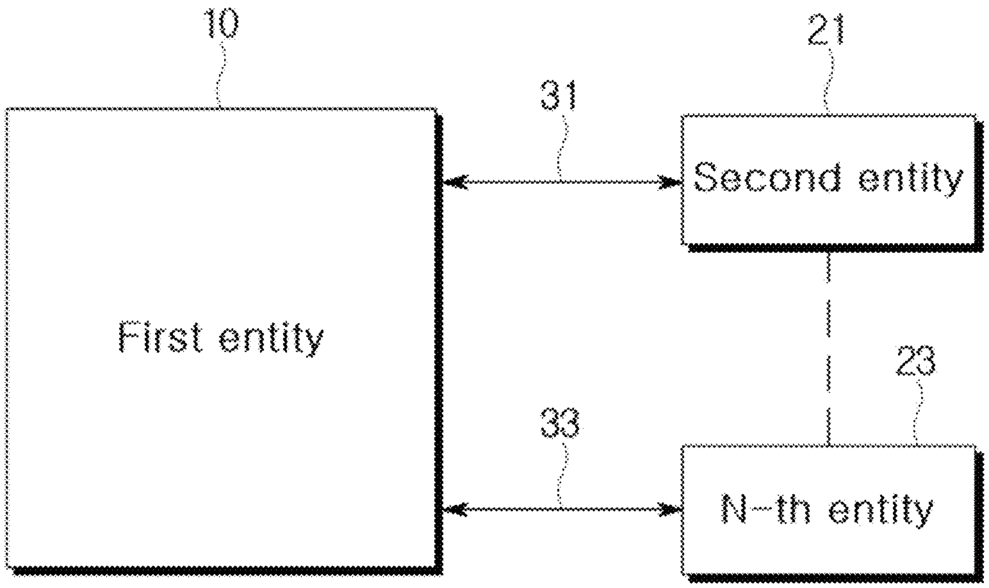
FIG. 1 is a diagram illustrating connections for data transmission between entities according to an embodiment of the disclosure.

FIG. 1 is a diagram illustrating connections for data transmission between entities according to an embodiment of the disclosure.

Referring to FIG. 1, a first entity 10, and a second entity 21 to an n-th entity 23 (where n is a whole number greater than 2) may have connections 31 and 33 for data transmission. Though not illustrated in FIG. 1, connections between the second entity 21 to the n-th entity 23 for data transmission may also be provided. The entity may be a device, a chip, or a block that performs functions allocated thereto independently. As seen in examples below, an entity may also be a device or apparatus that contains another entity.

The first entity 10, and the second entity 21 to the n-th entity 23 may be each different electronic devices. For example, the first entity 10 may be a digital camera, and the second entity 21 may be a memory connected through a connector of the digital camera.

In another example, two chips provided in one device may be the entities. For example, a plurality of NAND memories provided in an SSD (solid state drive) may be the second entity 21 to the n-th entity 23, and a memory controller chip controlling the NAND memories may be the first entity 10.

Similarly, a plurality of memory cores and a memory controller core may be provided in one chip. In this case, the memory controller core may be the first entity 10, and the plurality of memory cores may be the second entity 21 to the n-th entity 23.

These entities may be hard wired into one another using conductive lines, and may transmit information based on an agreed or pre-determined protocols.

Figure 2:
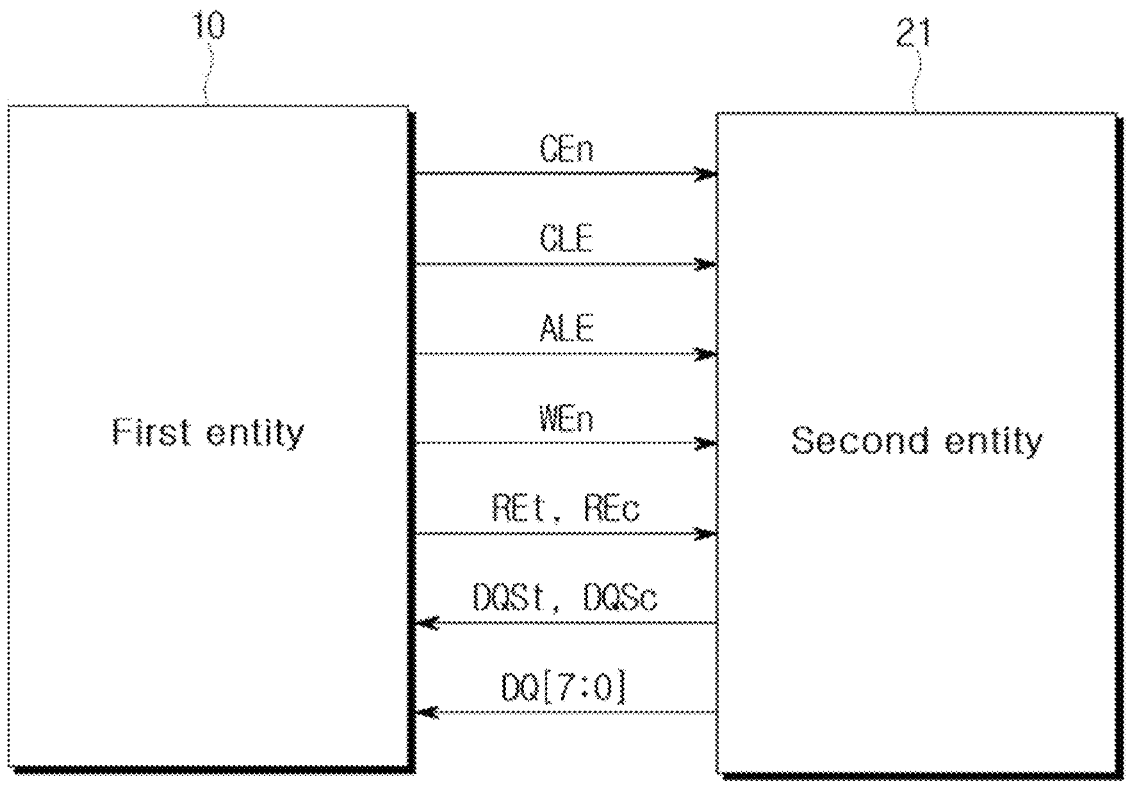
FIG. 2 is a view illustrating an example of signals used by a protocol for data transmission between entities according to an embodiment of the disclosure.

FIG. 2 is a view illustrating an example of a signal used by a protocol for data transmission between entities according to an embodiment of the disclosure.

Referring to FIG. 2, a chip select control signal CEn, a command control signal CLE, an address control signal ALE, a write control signal WEn, read enable indication signals REt and REc, data strobe signals DQSt and DQSc, and a data line DQ [7:0] may exist between the first entity 10 and the second entity 21. For example, when the memory controller of the storage device writes data into the memory or reads data from the memory, the conductive lines transmitting signals illustrated in FIG. 2 may be connected to and used by the entities.

The chip select control signal CEn may be used in selecting the second entity 21, which has processed the current data transmission when there are a plurality of second entities 21 and 23. Conductive lines capable of transmitting the chip select control signal CEn of the respective chip from the first entity 10 to the plurality of second entities 21 and 23 may have been connected. The 'n' placed at the end of the abbreviation 'CEn' representing the signal may be used to indicate that the signal is activated when the signal has a 'low' ('0') value, and not a high ('1') value. That is, the second entity 21 may recognize that the second entity 21 is chosen when a value of the chip select control signal CEn is low ('0'), not high ('1').

When the command control signal CLE has a 'high' value, information that a command giving an instruction to a chip chosen by the chip select control signal Cen is transmitted is indicated through the data line DQ [7:0], and when the address control signal ALE has a 'high' value, information that an address to write data into or to read data from a chip chosen by the chip select control signal CEn is transmitted is indicated through the data line DQ [7:0].

The write control signal WEn may be used to notify a time point when the second entity 21 has to obtain a command, an address, or data, when transmitting a command, an address, or data to the second entity 21 through the data line DQ [7:0]. For example, the second entity 21 may read a value contained in the data line DQ [7:0] at a time point when a value of the write control signal WEn is changed from a low to a high level so as to obtain a command, an address, or data.

The read enable indication signals REt and REc may be signals through which the first entity 10 notifies the second entity 21 that the first entity 10 is able to accept data. The second entity 21 may contain data in the data line DQ [7:0] to drive the data strobe signals DQSt and DQSc based on changes of the read enable indication signals REt and REc from a low to a high level, or from a high to a low level.

When the first entity 10 transmits data to the second entity 21, the read enable indication signals REt and REc are not used, and the first entity 10 may send data through the data line DQ [7:0] and drive the data strobe signals DQSt and DQSc.

Here, the read enable indication signals REt and REc and the data strobe signals DQSt and DQSc may be differential signals. That is, a first signal REt of the read enable indication signals may transmit a normal signal and the second signal REc of the read enable indication signals may transmit an inverted signal with respect to the first signal REt. Similarly, a first signal DQSt of the data strobe signals may transmit a normal signal, and a second signal DQSc of the data strobe signals may transmit an inverted signal with respect to the first signal DQSt. As such, by transmitting the differential signals, it is possible to detect signals with more precise timing without noise at a receiving end. That is, by using the differential signals, the time points when the signal is changed from a low to a high level, or from a high to a low level, can be recognized more precisely. However, in other embodiments, the read enable indication signals and the data strobe signals may use a normal signal only, without using the differential signals.

Figure 3:
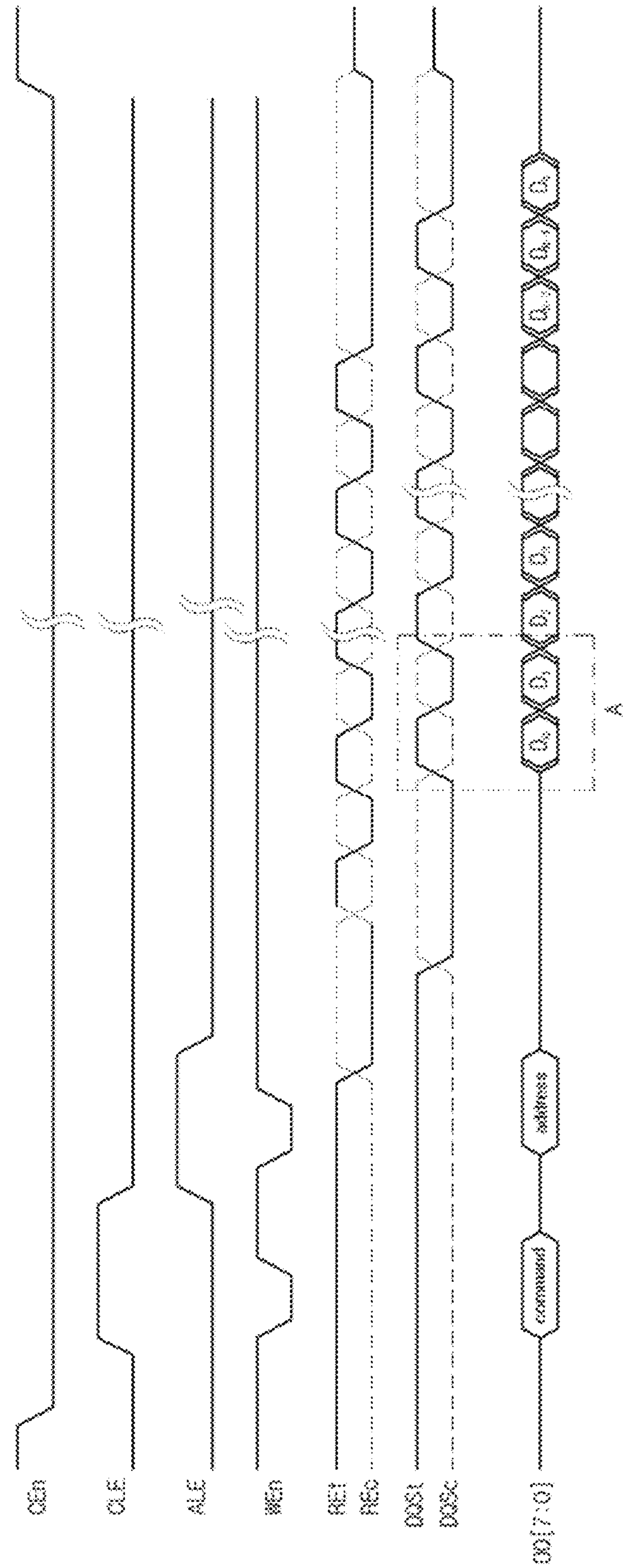
FIG. 3 is an example of a timing diagram when a first entity reads data from a second entity using signals illustrated in FIG. 2 according to an embodiment of the disclosure.

FIG. 3 is an example of a timing diagram when a first entity reads data from a second entity using signals illustrated in FIG. 2 according to an embodiment of the disclosure.

FIG. 3 may be an example of a timing between signals when the first entity (for example, the memory controller) reads data stored in the second entity (for example, the memory).

Referring to FIG. 3, a first entity 10 may drive a chip select control signal CEn of a second entity 21 to be low and may read data from the second entity 21. In addition, the first entity 10 may transmit a value indicating a read command through the data line DQ [7:0] while driving the command control signal CLE to be high, and may drive the write control signal WEn from a high to a low level so that the second entity 21 may recognize a command transmitted by the first entity 10.

Next, the first entity 10 may continue driving the chip select control signal CEn to be low, transmit an address value through the data line DQ [7:0] while driving the address control signal ALE to be high, and drive the write control signal WEn to change from a low to a high level so that the second entity 21 may obtain an address targeted by the first entity 10 to read. At this time, if a length of a bit indicating an address is long, the first entity 10 may perform the above operation repeatedly to deliver the address to the second entity 21.

Next, the first entity 10 may transmit the read enable indication signals REt and REc to notify, to the second entity 21, that the first entity 10 can receive data. The read enable indication signals REt and REc may be changed from a high to a low level, and from a low to a high level, at regular intervals after starting from a change of the normal signal (REt) from a low to a high level. The first entity 10 may not transmit the read enable indication signals REt and REc when the first entity 10 determines that there is no buffer to store data to be received or all data to be read has been received.

The second entity 21 may transmit the data strobe signals DQSt and DQSc and data $D_0$ to $D_N$ (where N is a whole number) to the first entity 10 based on a change of the read enable indication signals REt and REc from a low to a high level, or from a high to a low level. In other words, the data transmission of the second entity 21 may be synchronized to a time point at which the read enable indication signals REt and REc are changed from a low to a high level or a high to a low level. Further, the second entity 21 may transmit the data $D_0$ to $D_N$ in synchronization with the changes of the data strobe signals DQSt and DQSc from a low to a high level or a high to a low level. At this time, the second entity 21 may transmit the data strobe signals DQSt and DQSc and data $D_0$ to $D_N$ within a preset delay time from a time point when the second entity 21 recognizes a change in the read enable indication signals REt and REc.

The first entity 10 may obtain the data $D_0$ to $D_N$ that have been transmitted through the data line DQ [7:0] after having been synchronized at a time point when the data strobe signals DQSt and DQSc changes from a low to a high level, or from a high to a low level. According to an embodiment of the disclosure, the first entity 10 may obtain data by latching the data line DQ [7:0] after a preset time elapses upon recognizing the change of the data strobe signals DQSt and DQSc from a low to a high level, or from a high to a low level.

Figure 4:
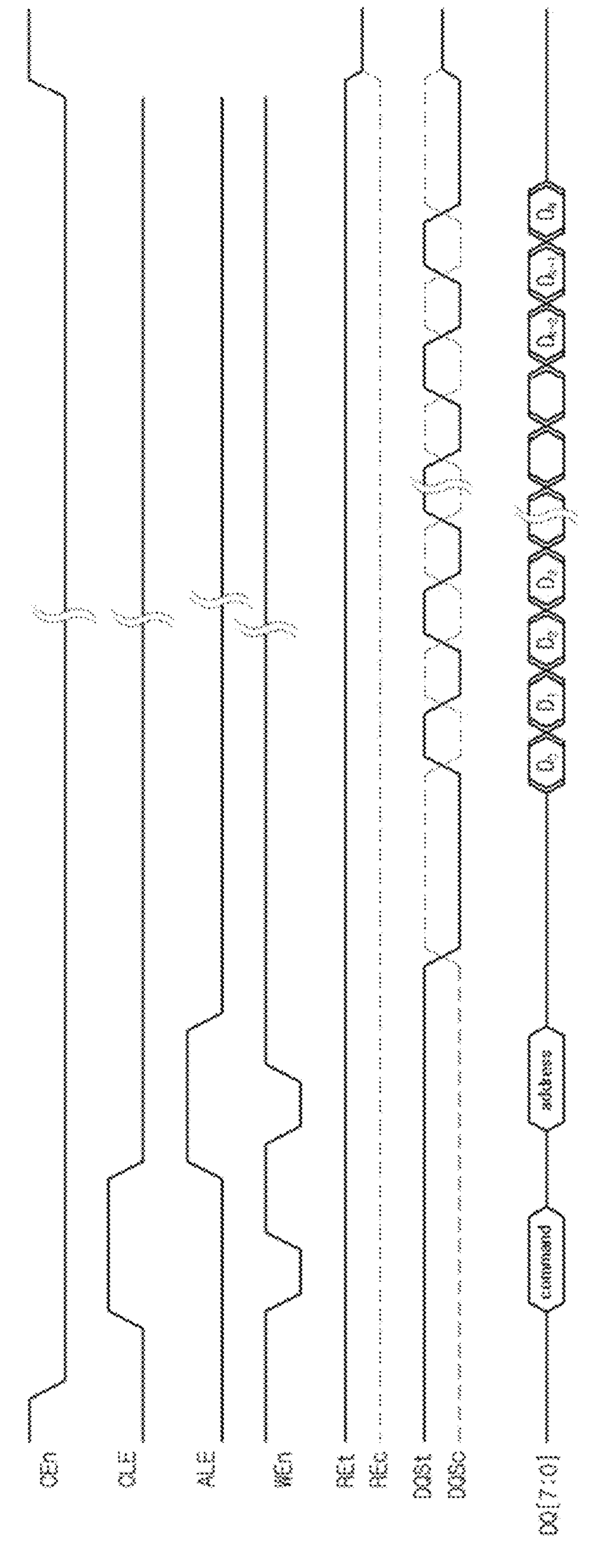
FIG. 4 is an example of a timing diagram when a first entity writes data into a second entity using signals illustrated in FIG. 2 according to an embodiment of the disclosure.

FIG. 4 is an example of a timing diagram when a first entity writes data into a second entity using signals illustrated in FIG. 2 according to an embodiment of the disclosure.

FIG. 4 illustrates an example of timings between signals when a first entity (for example, a memory controller) transmits data to be written into a second entity (for example, a memory).

Referring to FIG. 4, a first entity 10 may drive a chip select control signal CEn of a second entity 21 to low and write data into the second entity 21. In addition, the first entity 10 may transmit a value indicating a write command through a data line DQ [7:0] while driving a command control signal CLE to high, and may signal the second entity 21 to recognize a command transmitted by the first entity 10 by driving a write control signal WEn from a low to a high level.

Next, the first entity 10 may continue driving the chip select control signal CEn to be low, may transmit an address value indicating an address for data to be written through the data line DQ [7:0], and may drive the address control signal ALE to be high and drive the write control signal WEn from a low to a high level. Thus, the second entity 21 can obtain an address targeted by the first entity 10 for writing the data, and if a length of a bit indicating an address is long, then the first entity 10 may repeat the above operation to deliver the address to the second entity 21.

When the first entity 10 intends to write data into the second entity 21, the first entity 10 need not drive the read enable indication signals REt and REc. The first entity 10 may change a normal signal DQSt of the data strobe signals DQSt and DQSc from a high to a low level so that the second entity 21 can prepare for receiving data. According to an embodiment, the second entity 21 may prepare for receiving data at a time point when the second entity 21 receives a write command.

The first entity 10 may transmit the data strobe signals DQSt and DQSc and the data $D_0$ to $D_N$ to the second entity 21. the first entity 10 may transmit the first data $D_0$ with synchronizing to the change of the normal signal DQSt of the data strobe signals DQSt and DQSc from a low to a high level. According to an embodiment of the disclosure, the first entity 10 may transmit each data to the second entity 21 before changing the data strobe signals DQSt and DQSc. Thus, a time point when the data strobe signals DQSt and DQSc change may become a middle of a transmission time region of each data as illustrated in FIG. 4. This timing relationship is different with the timing relationship illustrated in FIG. 3, between the data strobe signals DQSt and DQSc and the data $D_0$ to $D_N$ when reading data from the second entity 21.

The second entity 21 may obtain the data $D_0$ to $D_N$ that have been transmitted through the data line DQ [7:0] after having been synchronized at a time point when the data strobe signals DQSt and DQSc change from a low to a high level, or from a high to a low level. According to an embodiment of the disclosure, the second entity 21 may obtain data by latching the data line DQ [7:0] as soon as the second entity 21 recognizes the change of the data strobe signals DQSt and DQSc from a low to a high level, or from a high to a low level.

In the above-mentioned embodiment, the data line is described to be 8 bits, however, the data line may be 16 bits and the data line may be configured to transmit more than 16 bits simultaneously.

Figure 5:
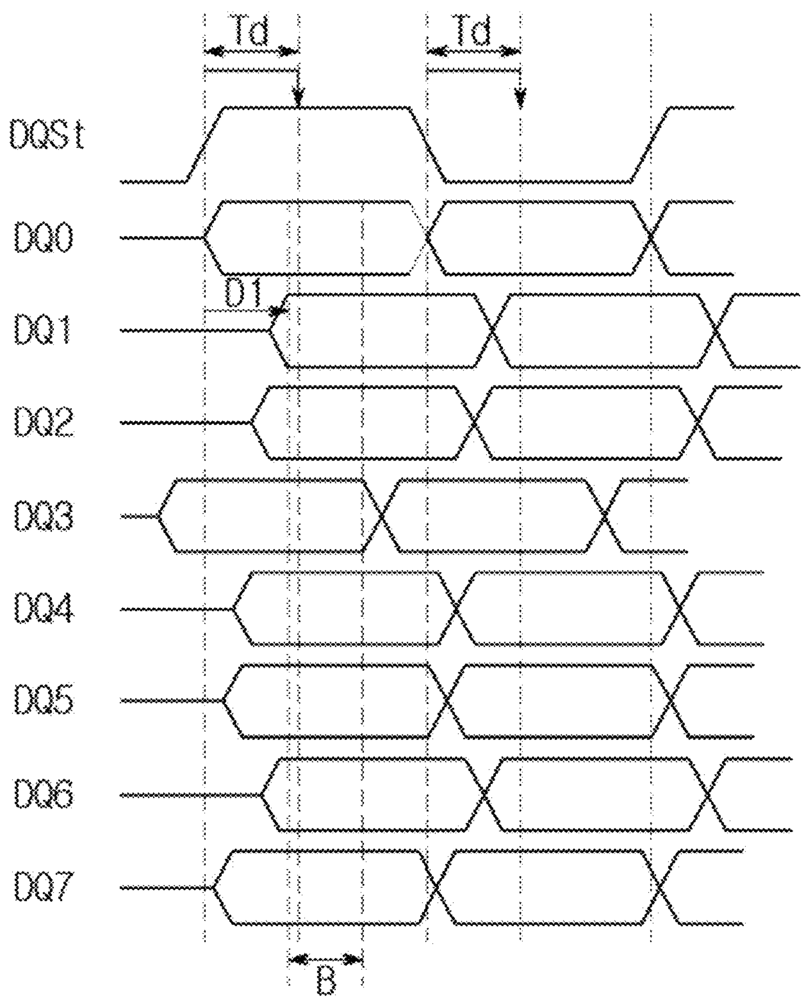
FIG. 5 is an example of obtaining data from an entity that receives data in part A of FIG. 3.

FIG. 5 is an example of obtaining data from an entity that receives data in part A of FIG. 3.

FIG. 5 is an enlarged view of part A of FIG. 3 illustrated in more detail, and with second signal (DQSc) of the data strobe signal omitted for convenience.

Referring to FIG. 5, due to characteristics of an output buffer used to transmit each signal of the data line contained in the second entity 21 and differences in lengths of the data lines connected between the first entity 10 and the second entity 21, the time point at which the first entity 10 receives each data bit may be different on the basis of the data strobe signals DQSt and DQSc.

The first entity 10 may obtain data by latching the data line DQ [7:0] after a certain delay time Td upon recognizing the data strobe signals DQSt and DQSc. However, as illustrated in FIG. 5, since there are differences in reception times of each data line bit, the first entity 10 may obtain values of all the data line bits without any error only by latching the data line DQ [7:0] within a time interval of B illustrated in FIG. 5.

According to an embodiment of the disclosure, the first entity 10 may determine and use a delay time Td for latching the data line DQ [7:0] after recognizing the data strobe signals DQSt and DQSc through a training so that the first entity 10 can obtain values of all the data line bits without an error. While it would be preferable that the delay time Td at which all the data line bits illustrated in FIG. 5 can be latched without any error is set within the time intervals (B), as illustrated in FIG. 5 however, it is likely that the delay time Td may be set ahead or at a rear of the interval (B). In this case, a slight change of the delay time of the data bit may lead to an error in obtaining an accurate data value.

In addition, the delay time experienced by the data line and the data strobe signals DQSt and DQSc described above may become different depending on a temperature and depending on the second entity that transmits them. Therefore, if setting a single delay time according to the prior art, an error may be caused when receiving data. For example, in FIG. 5, if the delay time Td is set to be smaller than a relative delay time (D1) of the second data bit DQ1, there may be an error in receiving a value of the second data bit DQ1.

The present disclosure suggests a measure to perform a plurality of latches in order to minimize the above-mentioned error when receiving data.

Figure 6:
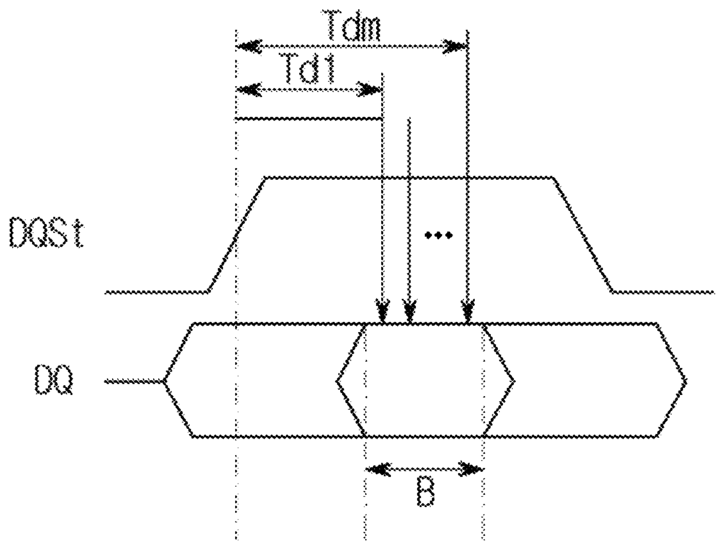
FIG. 6 is a view illustrating a method for receiving data by a first entity according to an embodiment of the present disclosure.

FIG. 6 is a view illustrating a method for receiving data by a first entity according to an embodiment of the present disclosure.

Referring to FIG. 6, a method for receiving data is to perform a latch with respect to the data line DQ for a preset number (m) of times, where m is a whole number greater than one. The latch for an m-number of times may be performed after a first delay time Td1, a second delay time Td2, and an m-th delay time Tdm, respectively, after a time point when the data strobe signals DQSt and DQSc are recognized.

The first entity 10 may perform the latch a plurality of times and temporarily store a value obtained from each latch with respect to each data bit as seen in the example of Table 1 below.

TABLE 1

| | DQ7 | DQ6 | DQ5 | DQ4 | DQ3 | DQ2 | DQ1 | DQ0 |
|---|---|---|---|---|---|---|---|---|
| first latch value | 1 | 0 | 1 | 1 | 0 | 0 | 1 | 0 |
| second latch value | 1 | 0 | 1 | 1 | 1 | 0 | 1 | 0 |
| third latch value | 1 | 0 | 1 | 1 | 1 | 0 | 1 | 0 |
| fourth latch value | 1 | 0 | 1 | 0 | 1 | 0 | 1 | 0 |
| fifth latch value | 1 | 1 | 1 | 0 | 1 | 0 | 1 | 0 |
| final determined value | 1 | 0 | 1 | 1 | 1 | 0 | 1 | 0 |

In addition, according to an embodiment, the first entity 10 may determine a final determined value based on a majority decision. For example, a data bit DQ7, a data bit DQ5, and a data bit DQ1 all have the latch value of 1, therefore, the first entity 10 may determine that a final determined value of the data bit DQ7, the data bit DQ5 and the data bit DQ1 as 1. The data bit DQ2 and a data bit DQ0 all have the latch value of 0, therefore, the first entity 10 may determine that a final determined value of the data bit DQ2 and the data bit DQ0 as 0. Since the data bit DQ6 has a latch value of 0 four times and 1 once, the first entity 10 may determine that a final determined value of the data bit DQ6 as 0 based on a majority decision. Since the data bit DQ3 has a latch value of 0 once and 1 four times, the first entity 10 may determine that a final determined value of the data bit DQ3 as 1 based on a majority decision. Since the data bit DQ4 has a latch value of 0 twice and 1 three times, the first entity 10 may determine that a final determined value of the data bit DQ4 as 1 based on a majority decision.

Figure 7:
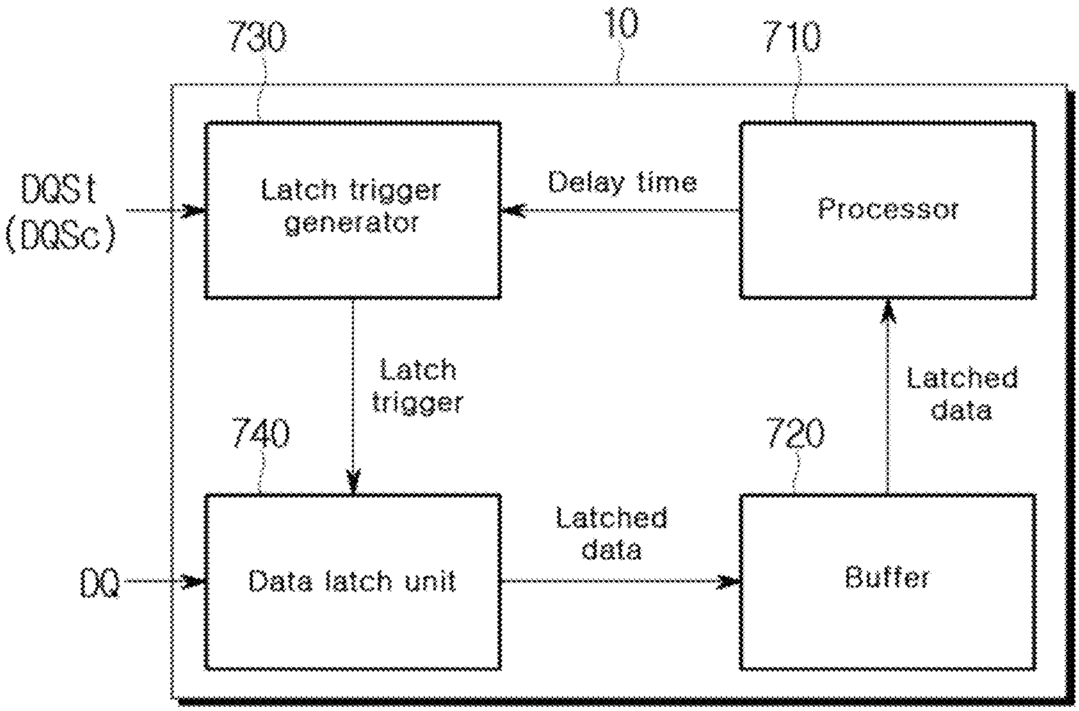
FIG. 7 is a diagram illustrating a configuration of a first entity for receiving data transmitted to a data line for an operation illustrated in FIG. 6 according to an embodiment of the disclosure.

FIG. 7 is a diagram illustrating a configuration of the first entity for receiving data transmitted to a data line for an operation illustrated in FIG. 6 according to an embodiment of the disclosure.

The configuration of FIG. 7 shows a configuration with a minimum of elements necessary to implement an operation of FIG. 6, however, the first entity may include additional elements in the configuration to perform in addition those shown in FIG. 7.

Referring to FIG. 7, a first entity 10 may include a processor 710, a buffer 720, a latch trigger generator 730, and a data latch unit 740 to receive data from a second entity 21.

The latch trigger generator 730 may generate a plurality of latch triggers based on data strobe signals DQSt and DQSc received from the second entity 21. According to an embodiment of the disclosure, the latch trigger generator 730 may obtain information of a plurality of delay times (for example, a first delay time Td1, a second delay time Td2, and an m-th delay time Tdm) for generating the plurality of latch triggers from the processor 710. The latch trigger generator 730 may recognize a time point when the data strobe signals DQSt and DQSc change from a low to a high level, or from a high to a low level, and may generate each of the plurality of latch triggers after each of the plurality of delay times from the time point when the data strobe signals DQSt and DQSc change. For example, referring to FIG. 6, the latch trigger generator 730 may generate a first latch trigger after a first delay time Td1 elapses from the time point of a change of the data strobe signals DQSt and DQSc. The latch trigger generator 730 may generate a second latch trigger after a second delay time Td2 elapses from the time point of the change of the data strobe signals DQSt and DQSc. Further, the latch trigger generator 730 may generate an m-th latch trigger after an m-th delay time Tdm elapses from the time point of the change of the data strobe signals DQSt and DQSc.

In the buffer 720, the data latch unit 740 may store a value obtained by latching the data line DQ based on the plurality of latch triggers received from the latch trigger generator 730. For example, in the buffer 720, the data latch unit 740 may store a first data value obtained by latching the data line DQ based on a first latch trigger received from the latch trigger generator 730. In addition, in the buffer 720, the data latch unit 740 may store a second data value and an m-th data value obtained by latching the data line DQ based on a second latch trigger and an m-th latch trigger received from the latch trigger generator 730, respectively.

As disclosed in Table 1, an m-number of latched data including the first data, the second data, and the m-th data latched in the data latch unit 740 may be stored in the buffer 720.

The processor 710 may determine a final data value based on the m-number of latched data stored in the buffer 720. Using a process described above based on Table 1, the processor 710 may check an m-number of latched values per data bit, and determine a final determined value for each data bit according to the value associated with the majority of latched values. For example, the first entity 10 may perform latching five times for one data bit, and may determine for the data bit a final determined value, which is associated with the value that has been latched for a greater number of times among a high value and a low value.

In the above-mentioned description, an operation in the first entity 10 to receive data without an error has been described, however, the above-mentioned operation may be performed in the second entity 21 in substantially the same way. A method of operation to be described below may be performed regardless of whether the subject is the first entity or the second entity.

Figure 8:
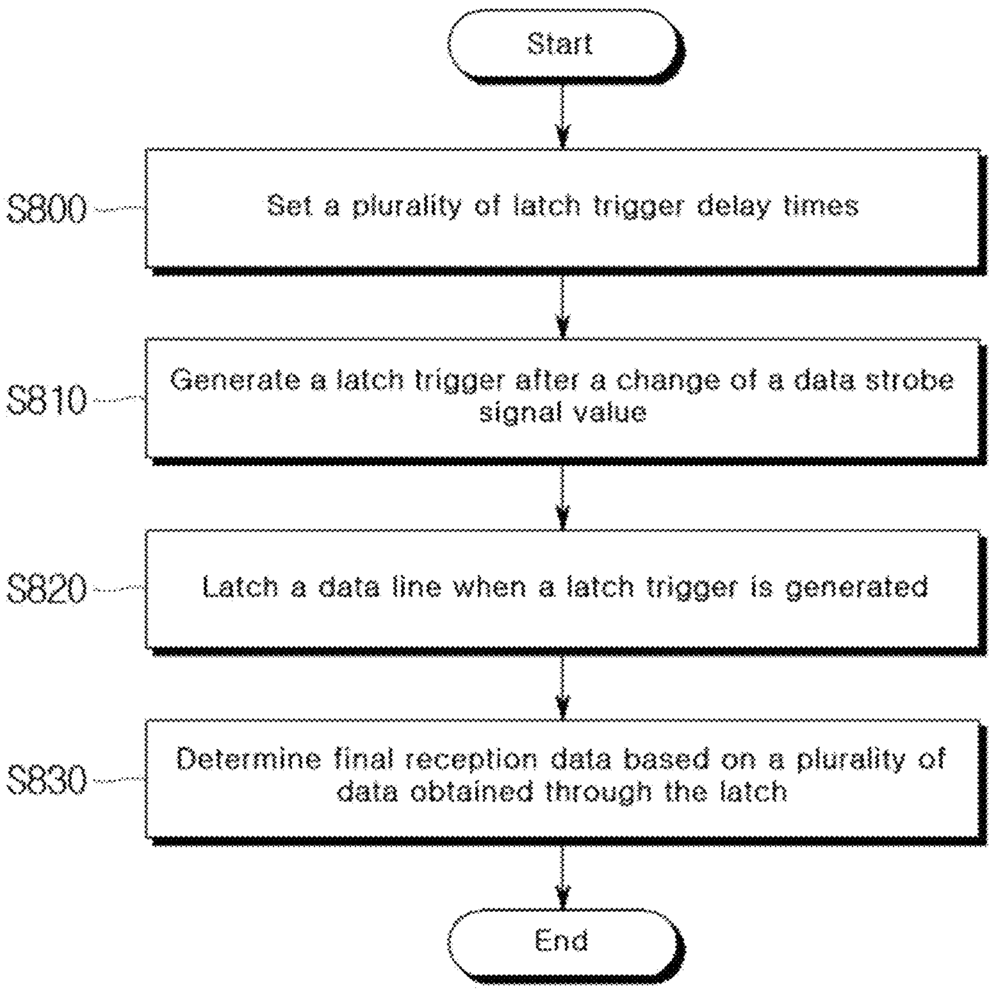
FIG. 8 is a flowchart illustrating an operation of an entity that receives data based on a data strobe signal according to an embodiment of the disclosure.

FIG. 8 is a flowchart illustrating an operation of an entity that receives data based on a data strobe signal according to an embodiment of the disclosure.

The operations of FIG. 8 may be performed by a master entity (for example, a first entity 10) configured to generate control signals for data transmission, or a slave entity (for example, a second entity 21 to an n-th entity 23) configured to receive and operate control signals for data transmission.

Referring to FIG. 8, in step S800, the entities 10, 21 and 23 may set up delay times for each of the plurality of latch triggers, which are signals for latching data lines DQ. As illustrated in FIG. 6, with respect to one data, the entities 10, 21 and 23 may perform latch for a plurality of times using the plurality of latch triggers. The latch trigger may be generated after preset delay times elapse from a time point when values of the data strobe signals DQSt and DQSc are changed from a low to a high level, or from a high to a low level.

The entities may perform a training for determining the delay time, and the training will be described in detail below.

In step S810, the entities 10, 21 and 23 may generate the latch trigger whenever a delay time, which has been set in step S800, elapses, after values of the data strobe signals are changed from a low to a high level, or from a high to a low level.

In step S820, the entities 10, 21 and 23 may obtain data by latching the data line DQ whenever each of the plurality of latch triggers is generated. If the data line DQ is 8 bits, the entities 10, 21 and 23 may each obtain 8 bits of data, and if the data line DQ is 16 bits, the entities 10, 21 and 23 may each obtain 16 bits of data. That is, from one latch, the entities 10, 21 and 23 may each obtain one data comprised of the number of bits constituting the data line DQ.

For example, if a data line DQ is comprised of 8 bits, and five latch triggers are generated, the entities 10, 21 and 23 may each obtain five 8-bit data (from decimal numbers 0 to 255, from hexadecimal numbers '00' to 'FF').

In step S830, the entities 10, 21 and 23 may determine a final reception data based on a plurality of data that have been obtained by latching the data line DQ during the latch trigger.

There may be several ways for entities 10, 21 and 23 to determine the final reception data.

In an embodiment, as described referring to Table 1, the final reception data may be determined by aggregating the final determined value of each of the data line DQ.

In another embodiment, the final reception data may be determined based on a frequency of an aggregated latched value of data line DQ7 to DQ0. In a further embodiment, high 4 bits of the final reception data may be determined based on a frequency of an aggregated latch value of data line DQ7 to DQ4 and low 4 bits of the final reception data may be determined based on a frequency of an aggregated latched value of data line DQ3 to DQ0.

TABLE 2

| | DQ7 | DQ6 | DQ5 | DQ4 | DQ3 | DQ2 | DQ1 | DQ0 | DQ |
|---|---|---|---|---|---|---|---|---|---|
| first latch value | 1 | 0 | 1 | 1 | 0 | 0 | 1 | 0 | B2 |
| second latch value | 1 | 0 | 1 | 1 | 1 | 0 | 1 | 0 | BA |
| third latch value | 1 | 0 | 1 | 1 | 1 | 0 | 1 | 0 | BA |
| fourth latch value | 1 | 0 | 1 | 0 | 1 | 0 | 1 | 0 | AA |
| fifth latch value | 1 | 1 | 1 | 0 | 1 | 0 | 1 | 0 | EA |

For example, as shown in Table 2, values represented by all of the data (8 bits), which have been latched in the data line DQ and represented as hexadecimal numbers 'B2', 'BA', 'BA', 'AA', and 'EA'. Among them, a value with the highest frequency is 'BA'. Therefore, 'BA' may be determined as the final reception data.

In another example referring to Table 2, values represented by an upper 4 bits (DQ7:DQ4) may be hexadecimal numbers, which are 'B', 'B', 'B', 'A', and 'E'. Among them, a value with the highest frequency is 'B'. Therefore, the entities 10, 21 and 23 may determine 'B' as a final reception data with respect to the upper 4 bits (DQ7:DQ4). Similarly, in Table 2, values represented by lower 4 bits (DQ3:DQ0) may be hexadecimal numbers, which are '2', 'A', 'A', 'A', and 'A'. Among them, a value with the highest frequency is 'A'. Therefore, the entities 10, 21 and 23 may determine 'A' as a final reception data with respect to the lower 4 bits (DQ3:DQ0). In addition, the entities 10, 21 and 23 may determine 'BA' as the final reception data for the data by adding 'B' determined with respect to the upper 4 bits (DQ7:DQ4) and 'A' determined with respect to the lower 4 bits (DQ3:DQ0).

Figure 9:
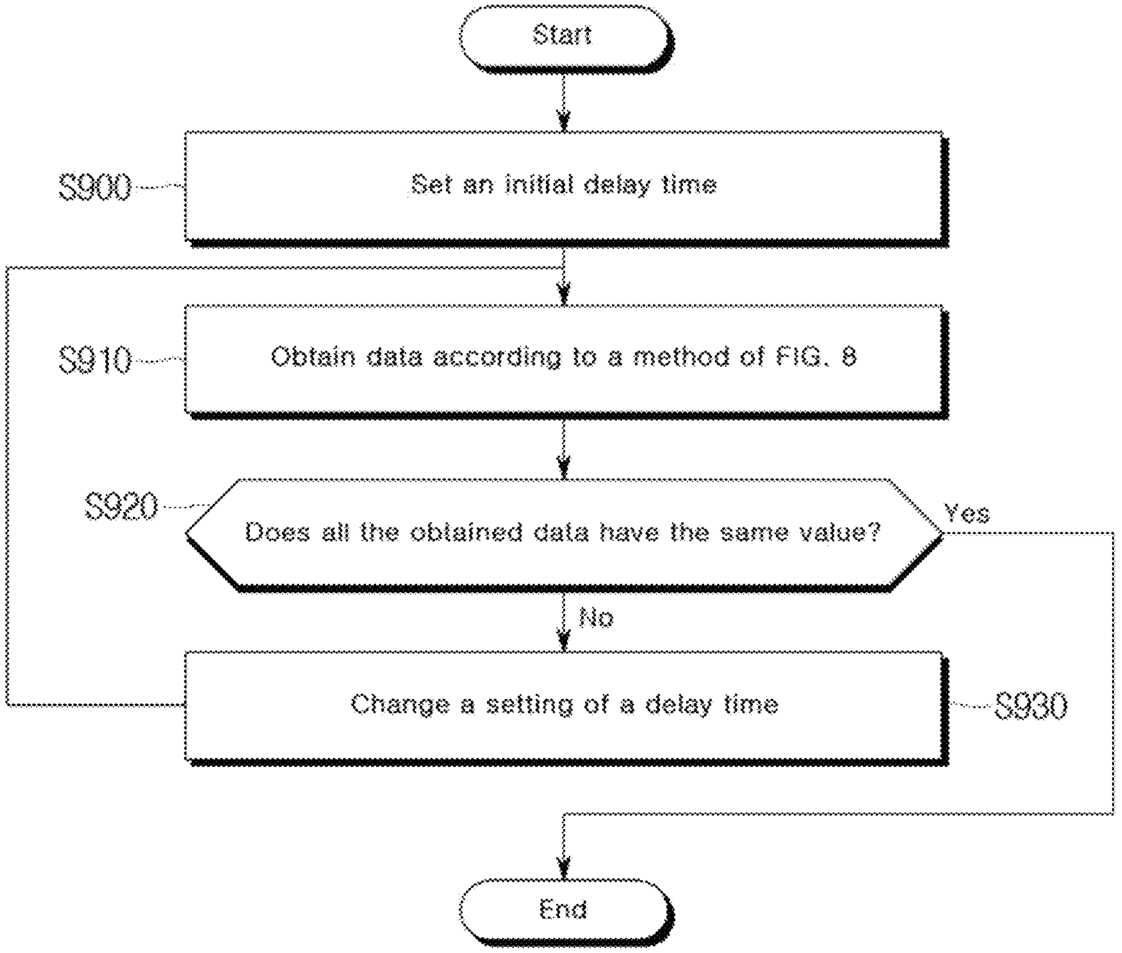
FIG. 9 is a flowchart illustrating an operation for determining a delay time used in step S800 of FIG. 8 according to an embodiment of the disclosure.

FIG. 9 is a flowchart illustrating an operation for determining a delay time used in step S800 of FIG. 8 according to an embodiment of the disclosure.

Through a training, entities 10, 21 and 23 may determine a delay time to be used in step S800.

Referring to FIG. 9, in step S900, the entities 10, 21 and 23 may set an initial delay time. The initial delay time may be generated arbitrarily as many times as required by the number of triggers generated.

According to an embodiment, the entities 10, 21 and 23 may set a first delay time to an m-th delay time by increasing each delay time by a preset time from 0. For example, if the time at which the data strobe signal is 'low' or 'high' is K, and the preset time is set to (K/M), the first delay time may be (K/M), the second delay time may be (2K/M), and the m-th delay time may be (mK/M), where M is any value greater than m.

In step S910, the entities 10, 21 and 23 may signal another connected entity to transmit data for the training with respect to the delay time. In addition, according to the steps in a method of FIG. 8, an m-number of latched data may be obtained.

In step S920, the entities 10, 21 and 23 may determine whether the obtained m-number of latched data all have the same value or not. If all of the m-number of latched data have the same value as a result of the determination, then the entities 10, 21 and 23 may end setting of the delay time.

If the m-number of latched data do not all have the same value as a result of the determination, the entities 10, 21 and 23 may change the setting of the delay time in step S930.

According to an embodiment, the entities 10, 21 and 23 may add the same amount of time to all the delay times that are currently set. For example, the entities 10, 21 and 23 may add (K/M) to all the m-number of delay times that are currently set, and so the first delay time may be (2K/M), the second delay time may be (3K/M), and the m-th delay time may be ((m+1) K/M). As another example, the entities 10, 21 and 23 may add (K/2M) to all the m-number of delay times that are currently set. Then, the first delay time may be (3K/2M), the second delay time may be (5K/2M), and the m-th delay time may be ((2m+1) K/2M).

According to another embodiment, if the m-th delay time is a value bigger than K, then the entities 10, 21 and 23 may reduce the time gap of the m-number of delay times that are currently set. For example, the entities 10, 21 and 23 may set an increase to the first delay time to the m-th delay time as (K/2M) from 0. Then, the first delay time may be set to increase from 0 by (K/2M). Accordingly, the first delay time may become (K/2M), the second delay time may become (2K/2M), and the m-th delay time may become (mK/2M).

In changing the delay time set in step S930, the entities 10, 21 and 23 may change the setting of the delay time by adding a set amount of time to all the delay times if the greatest delay time (i.e., the m-th delay time) is smaller than the time (K) at which the data strobe signal is in a low or a high level. Similarly, in step 930, the entities 10, 21 and 23 may change the setting of the delay time by reducing the time gap between the delay times if the greatest delay time is greater than the time (K) at which the data strobe signal is in a low or a high level.

The entities 10, 21 and 23 may perform the delay time training according to the flowchart of FIG. 9 based on various conditions.

According to an embodiment, the entities 10, 21 and 23 may perform the delay time training according to the flowchart of FIG. 9 at a regular time interval (for example, 1 month).

According to another embodiment, the entities 10, 21 and 23 may perform the delay time training according to the flowchart of FIG. 9 whenever power is supplied to the entities.

According to still another embodiment, the entities 10, 21 and 23 may perform the delay time training according to the flowchart of FIG. 9 when there is a gap equal to a preset value or more between a temperature at the previous delay time setting and the current temperature.

According to yet another embodiment, the entities 10, 21 and 23 may perform the delay time training according to the flowchart of FIG. 9 when there is at least two different values among all of the data obtained while performing step S820 of FIG. 8. Alternatively, the entities 10, 21 and 23 may perform the delay time training according to the flowchart of FIG. 9 when the frequency of a value determined as the final reception data is equal to or less than a preset value, after comparing all the data obtained while performing step S830 of FIG. 8.

In addition to the above-mentioned conditions, the entities 10, 21 and 23 may perform the delay time training according to the flowchart of FIG. 9 based on various conditions.

Figure 10:
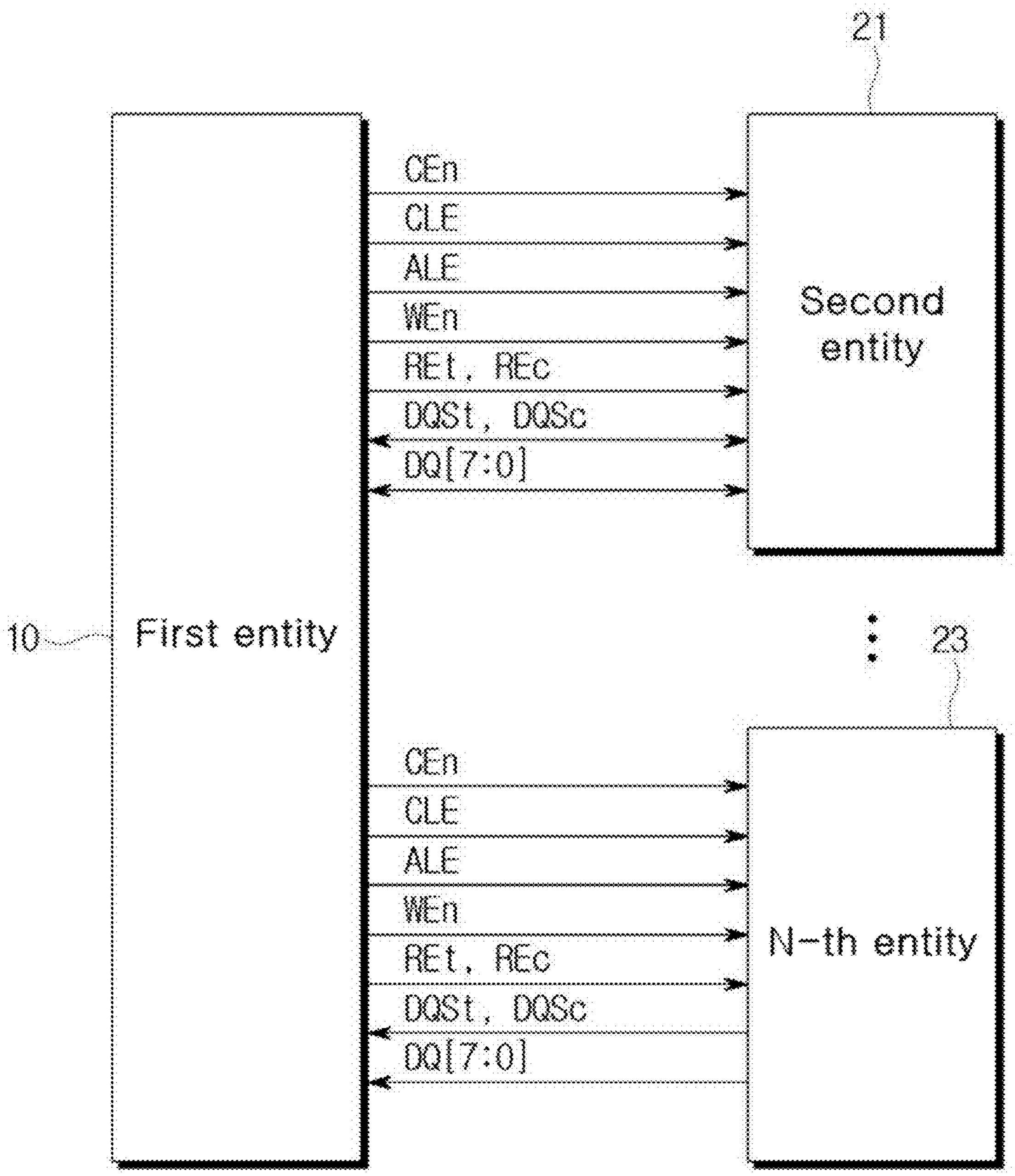
FIGS. 10 and 11 are views illustrating connection relationships of signals for data transmission when a plurality of second entities are connected to a first entity.
Figure 11:
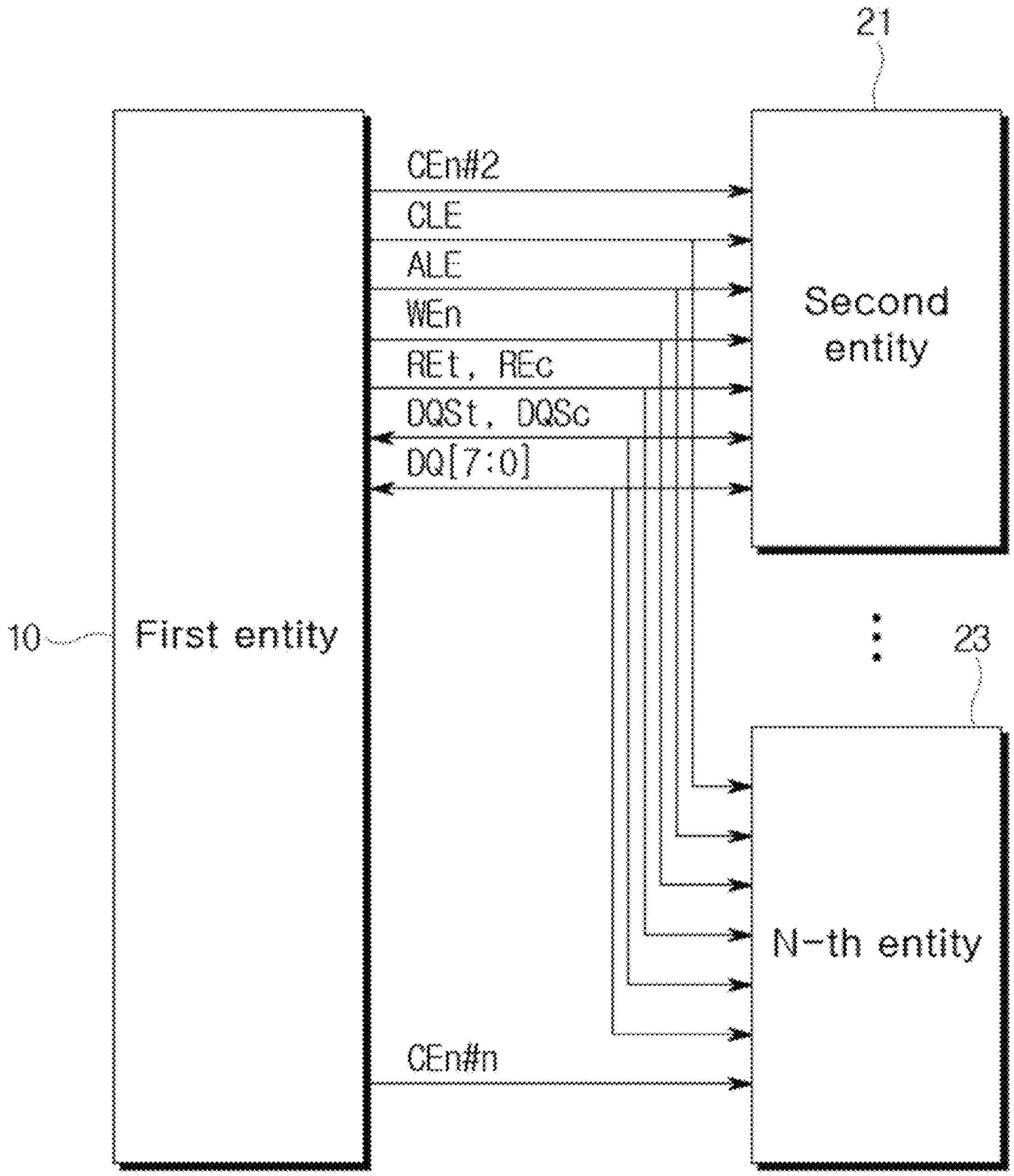

The descriptions above referring to FIGS. 2 to 9 describe examples in which a first entity is connected to a second entity, however, more than one second entity may be connected to the first entity. FIGS. 10 and 11 are views illustrating connection relationships of signals for data transmission when a plurality of second entities are connected to a first entity.

As illustrated in FIG. 1, if a plurality of second entities 21 and 23 are connected to a first entity 10, then the signals for data transmission may be separately provided for each of the plurality of second entities 21 and 23 as illustrated in FIG. 10. In another alternative, only the chip select control signal CEn may be separately provided as illustrated in FIG. 11, and the rest of the signals may be connected to all of the plurality of second entities 21 and 23 in a form of a bus.

In addition, regardless of the manner of connection in FIG. 10 or FIG. 11, the configuration of the first entity 10 of FIG. 7 may be maintained. However, the processor 710 may be able to additionally generate signals for selecting an entity, for transmitting data or for reading data, for transmitting the signal, or for switching selection of a signal coming from a pin connected to each entity, and such configurations may be arranged in a multiplexing manner, which is well known to those skilled in the art.

A first entity 10, to which a plurality of entities are connected, may independently perform operations of FIGS. 8 and 9. In particular, the values of the delay times determined by the operations of FIG. 9 may be different for each entity, and the values may be stored separately by entity in the memory.

Hereinafter, a method for receiving data described above applied to a storage device will be described as an embodiment.

Figure 12:
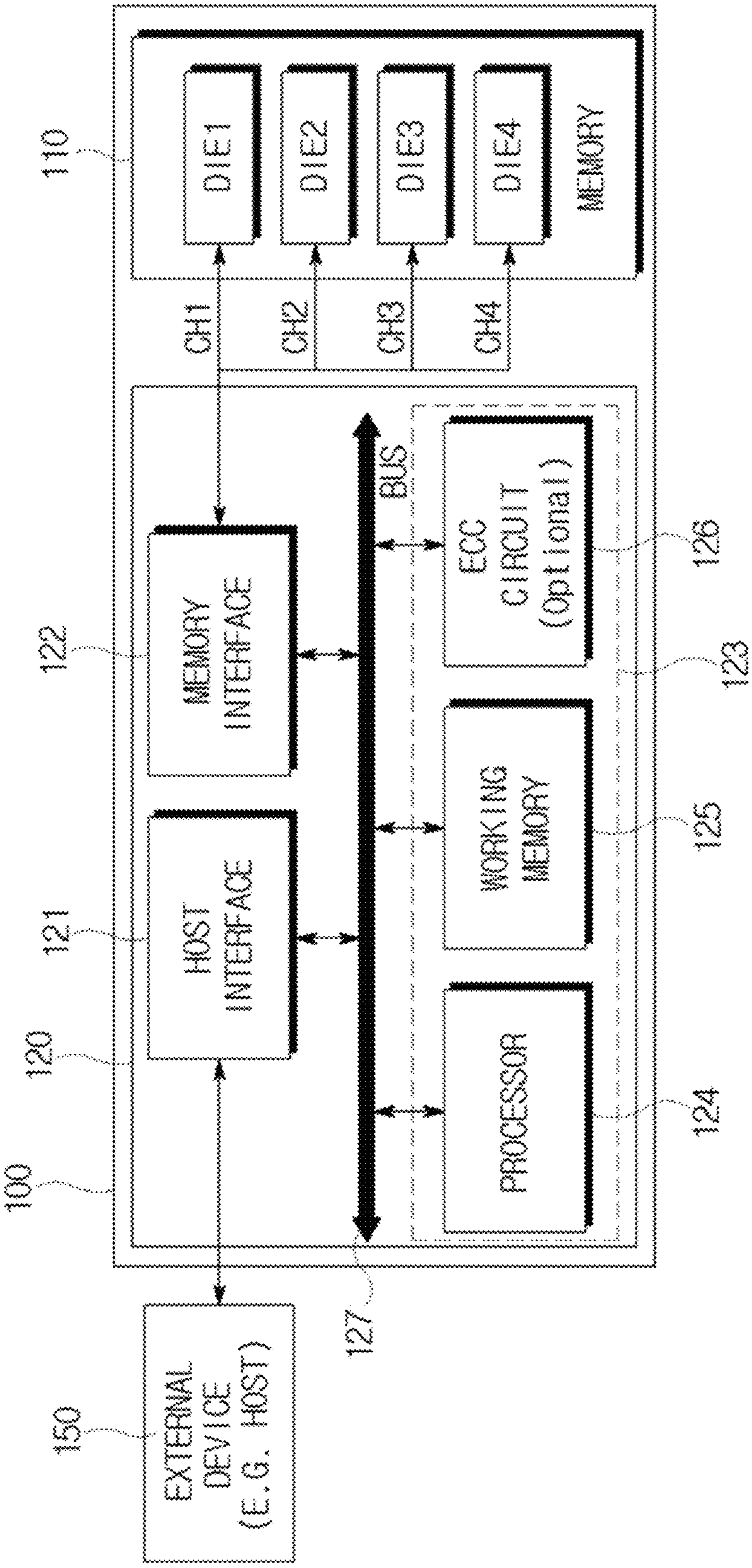
FIG. 12 is a schematic configuration diagram of a storage device according to embodiments of the present disclosure.

FIG. 12 is a schematic configuration diagram of a storage device according to embodiments of the present disclosure.

Referring to FIG. 12, a storage device 100 according to embodiments of the present disclosure may include a memory 110 for storing data, a controller 120 for controlling the memory 110, and the like.

The memory 110 may include a plurality of memory dies DIE1 to DIE4. The plurality of memory dies DIE1 to DIE4 responds to control of the controller 120 through a plurality of channels CH1 to CH4. Here, the operation of the memory 110 may include, for example, a read operation, a program operation (or may be referred to as a write operation), and an erase operation and the like.

At least one memory die may be connected to each of the plurality of channels CH1 to CH4. If a plurality of dies are connected to only one channel, then one read command or program command may be connected to only one die among the plurality of dies. That is, if a plurality of dies are connected to a single channel, then simultaneous access to the plurality of dies is impossible, and only one command from the one die may be applied. Therefore, in the embodiments below, examples will be described in which a plurality of memory dies is connected respectively to the plurality of channels CH1 to CH4.

One channel may deliver an operation command to the memory die connected to each channel successively, or deliver data from the memory die to the controller 120 successively. In addition, a plurality of memory dies connected to different channels, which have received operation commands through different channels, may perform operations according to the commands simultaneously.

According to an embodiment, each memory die may include at least one or more plains. In addition, a plain may include a plurality of memory blocks.

For example, the memory 110 may be implemented in various types such as Double Data Rate Synchronous Dynamic Random Access Memory (DDR SDRAM), Low Power Double Data Rate4 (LPDDR4) SDRAM, Graphics Double Data Rate (GDDR) SDRAM, LPDDR (Low Power DDR), Rambus Dynamic Random Access Memory (RDRAM), NAND Flash Memory, 3D NAND Flash memory, NOR Flash memory, Resistive Random Access Memory (RRAM), Phase-Change Memory (PRAM), Magnetoresistive Random Access Memory (MRAM), Ferroelectric Random Access Memory (FRAM), or Spin Transfer Torque Random Access Memory (STT-RAM).

The memory 110 may be implemented as a three-dimensional array structure. Not only is the inventive concept applicable to a flash memory device, in which a charge storage layer is made up of a conductive floating gate, but it is also applicable to a Charge Trap Flash (CTF) memory device, in which a charge storage layer is made up of an insulation film.

The memory 110 may receive a command, an address, and the like from the controller 120, and may get access to a region of the memory cell array that is selected by an address. That is, the memory 110 may perform an operation instructed by the command with respect to the region selected by the address.

For example, the memory 110 may perform a program operation, a read operation, and an erase operation. When performing a program operation, the memory 110 may program data into a region selected by an address. In this regard, when performing a read operation, the memory 110 may read data from a region selected by an address. When performing an erase operation, the memory 110 may erase data stored in a region selected by an address.

The controller 120 may control a write (program) operation, a read operation, an erase operation, and a background operation with respect to the memory 110. Here, for example, the background operation may include at least one or more among garbage collection (GC), wear leveling (WL), read reclaim (RR), and bad block management (BBM) operations.

The controller 120 may control an operation of the memory 110 according to a request of a device (for example, a host) located outside of the storage device 100. On the other hand, the controller may control an operation of the memory 110, regardless or in the absence of a request of the external device.

An external device may be a computer, an Ultra Mobile PC (UMPC), a workstation, a Personal Digital Assistant (PDA), a tablet, a mobile phone, a smart phone, an e-book, a portable multimedia player (PMP), a portable game machine, a navigation device, a black box, a digital camera, a Digital Multimedia Broadcasting (DMB) player, a smart television, a digital audio recorder, a digital audio player, a digital picture recorder, a digital picture player, a digital video recorder, a digital video player, a storage constituting a data center, one of various electronic devices constituting a home network, one of various electronic devices constituting a computer network, one of various electronic devices constituting a telematics network, a radio frequency identification (RFID) device, and a mobile device (e.g. vehicle, robot, drone) that travels on the ground, water or air under human control or autonomously travels.

The external device may include at least one operating system (OS). The operating system may generally manage and control functions and operations of an external device, and provide mutual operations between the external device and the storage device 100. The operating system may be divided into a general operating system and a mobile operating system according to the mobility of an external device.

The controller 120 and an external device may be separate devices. In some cases, the controller 120 and an external device may be implemented as an integrated device. Hereinafter, for convenience of description, an example in which the controller 120 and an external device are separate devices will be described.

Referring to FIG. 12, the controller 120 may include a memory interface 122, a control circuit 123, and the like and may further include a host interface 121.

The host interface 121 provides an interface for communication with an external device. For example, the host interface 121 may provide an interface that uses at least one among various interface protocols such as a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a proprietary protocol, and the like.

The control circuit 123 may receive a command through the host interface 121 and may perform an operation of processing the received command.

The memory interface 122 may be connected to the memory 110 to provide an interface for communication with the memory 110. That is, the memory interface 122 may be configured to provide an interface between the memory 110 and the controller 120 in response to a control of the control circuit 123.

The control circuit 123 may control an operation of the memory device 110 by performing overall control of the controller 120. To this end, the control circuit 123 may include one or more among a processor 124, and a working memory 125, and optionally may include an error detection and correction circuit (ECC Circuit) 126.

The processor 124 may control all operations of the controller 120 and perform logical operations. The processor 124 may communicate with an external device through the host interface 121, and may communicate with the memory 110 through the memory interface 122.

The processor 124 may perform a function of a flash translation layer (FTL). The processor 124 may translate a logical block address (LBA) provided by an external device into a physical block address (PBA) through a flash translation layer (FTL). Using a mapping table, the flash translation layer (FTL) may receive a logical block address (LBA) and translate it into a physical block address (PBA).

There are various address mapping methods that may be employed by the flash translation layer according to the mapping unit. Typical address mapping methods include a page mapping method, a block mapping method, and a hybrid mapping method.

The processor 124 may randomize data received from an external device. For example, the processor 124 may randomize data received from an external device using a set randomizing seed. The randomized data may be provided to the memory 110 and may be programmed into a memory cell array of the memory 110.

The processor 124 may derandomize data received from the memory 110 during a read operation. For example, the processor 124 may derandomize data received from the memory 110 using a derandomizing seed. The derandomized data may be output to an external device.

The processor 124 may control the operation of the controller 120 by executing firmware. In other words, the processor 124 may control overall operations of the controller 120 and execute (drive) firmware loaded in the working memory 125 during booting. Hereinafter, an operation of a storage device 100 described in embodiments of the present disclosure may be implemented in a way that the processor 124 executes firmware in which the corresponding operation is defined.

Firmware is a program being executed in the storage device 100 to drive the storage device 100 and may include various functional layers. For example, the firmware may include binary data in which codes for executing each of the above-mentioned functional layers are defined.

For example, the firmware may include a flash translation layer that performs a translation function between a logical address requested from an external device to the storage device 100 and a physical address of the memory 110, and a host interface layer (HIL) that receives and translates a command from the external device and delivers it to the flash translation layer (FTL), and a flash interface layer (FIL) that delivers a command instructed by the flash translation layer (FTL) to the memory 110.

Such firmware, for example, may be loaded into the working memory 125 from the memory 110 or a separate non-volatile memory (e.g., ROM, NOR Flash) located outside the memory 110. When executing a booting operation after power is turned on, the processor 124 may first load all or part of the firmware into the working memory 125.

The processor 124 may perform logic operations defined in firmware loaded into the working memory 125 to control the overall operations of the controller 120. The processor 124 may store, in the working memory 125, a result of performing a logic operation defined in the firmware. The processor 124 may control the controller 120 to generate a command or signal according to a result of performing a logic operation defined in the firmware. When part of the firmware, in which a logical operation to be performed is defined, is not loaded into the working memory 125, the processor 124 may generate an event (e.g., interrupt) for loading the corresponding part of the firmware into the working memory 125.

The processor 124 may load meta data required to drive the firmware from the memory 110. Meta data is data for managing the memory 110 and may include management information about user data stored in the memory 110.

The firmware may be updated while the storage device 100 is being produced or while the storage device 100 is running. The controller 120 may download new firmware from an external device of the storage device 100 and update the existing firmware to a new firmware.

The working memory 125 may store firmware, program codes, commands, or any number of data necessary to drive the memory controller 120. The working memory 125 may include at least one or more among, for example, a static RAM (SRAM), a dynamic RAM (DRAM), and/or a synchronous RAM (SDRAM) as a volatile memory.

The error detection and correction circuit 126 may be configured to detect error bits of target data using an error correction code, and to correct the detected error bit(s). For example, the target data may be data stored in the working memory 125, data read from the memory 110, or the like.

The error detection and correction circuit 126 may be implemented to decode data using the error correction code. The error detection and correction circuit 126 may be implemented using various code decoders. For example, the error detection and correction circuit 126 may be implemented with a decoder that performs nonsystematic code decoding or a decoder that performs systematic code decoding.

A bus 127 may be configured to provide a channel between the constituent elements 121, 122, 124, 125, and 126 of the memory controller 120. The bus 127 may include, for example, a control bus for delivering various kinds of control signals and commands, and a data bus for delivering various kinds of data.

Meanwhile, some of the elements of the above-mentioned constituent elements 121, 122, 124, 125, and 126 of the controller 120 may be omitted, or some of these elements may be integrated into a single element. The memory controller 120 may also contain one or more other elements in addition to the elements identified above.

According to various embodiments of the present disclosure, the memory interface 122 may include a configuration illustrated in FIG. 7, and may reduce bit errors that may occur during a read operation by operating according to steps illustrated in FIGS. 8 and 9 when reading data from the memory 110.

According to an embodiment, the memory interface 122 may be connected to the memory 110 as illustrated in FIG. 10, or as illustrated in FIG. 11, to respond to each channel. If the memory interface 122 is connected to the memory 110 as illustrated in FIG. 11, then even if a plurality of channels are provided, data transmission may be possible to only one channel at one time. If the memory interface 122 is connected to the memory as illustrated in FIG. 10, then data transmission may be made possible simultaneously to a plurality of channels.

In addition, referring to FIG. 7, the memory interface 122 may have different internal configurations depending on connection forms illustrated in FIG. 10 or 11. According to an embodiment, referring to FIG. 10, the memory interface 122 may have a configuration of FIG. 7 per channel, or each channel may separately have at least a latch trigger generator 730 and a data latch unit 740. Referring to FIG. 11, if the memory interface 122 only has one of the configuration illustrated in FIG. 7, then data reception at each channel may be performed through time-based multiplexing methods.

The memory controller 120 may detect error bits of read data using the error detection and correction circuit 126 and correct the detected error bits. However, in an embodiment, when a plurality of the error bits is detected, the error bits may not be corrected. Likewise, if the read data includes errors identified after the error detection and correction, then the conventional memory controller 120 may read the respective data from the memory 110 again. On the other hand, the memory controller 120 proposed by the present disclosure may not read the respective data from the memory 110 again, and may correct the error bit using the error detection and correction circuit again by means of a value that is not predetermined. The value of a byte used by the error detection and correction circuit may be determined from a plurality of values latched at the time of reception, rather than a value previously chosen. For example, in Table 2, it may be possible to correct the error bit using the error detection and correction circuit again by setting “AA” as the reception data value, rather than "BA", which is first determined during operations. If data is obtained without errors by doing so, then time and power consumed in reading the data may be further reduced.

According to an embodiment, the memory controller 120 may determine a byte for changing a value of the reception data based on a byte that appears to have an error detected by the error detection and correction circuit. Therefore, if the memory controller has a plurality of latch values with respect to one byte, the memory controller 120 may temporarily store all the plurality of latch values.

According to various embodiments of the present disclosure, the memory interface 122 or the processor 124 may set a plurality of different latch trigger delay times per channel or a plurality of different latch trigger delay times per die. If a plurality of dies is connected to one channel, even if receiving data with the same channel, then the latch trigger delay time may be set differently depending on the die which was read. The set latch trigger delay time may be stored in the memory 110, and may be loaded together when the firmware is loaded to the working memory 125 to be used.

Meanwhile, the reception performance with respect to the signal coming from the memory interface 122 may be improved when the memory 110 has a configuration of FIG. 7 per channel.

As described above, the method for receiving data when transmitting data between the controller 120 and the memory 110 of the storage device 100 according to the present disclosure, or the method for receiving data when transmitting data between the first entity and the second entity may improve reception reliability by using a plurality of latch values, and may reduce error occurrence, thereby reducing power consumption and improving the overall performance by minimizing an additional read operation necessary for handling the error.

The method for receiving data described by the present disclosure may include at least characteristics described below.

One embodiment is an electronic apparatus, including: a latch trigger generator configured to generate a plurality of latch triggers based on an input data strobe signal and a plurality of preset delay times; a data latch unit configured to latch a data line based on the plurality of latch triggers to generate a plurality of latched data; and a processor configured to set the plurality of delay times and determine reception data based on the plurality of latched data.

According to various embodiments of the present disclosure, the latch trigger generator may generate the plurality of latch triggers at time points corresponding to the plurality of delay times, when the plurality of delay times elapse from a time point when the data strobe signal is changed from a low to a high level, or from a high to a low level, and the data latch unit may latch the data line at time points when the plurality of latch triggers are generated.

According to various embodiments of the present disclosure, the processor may determine a value having a highest frequency from among values of the plurality of latched data as the reception data.

According to various embodiments of the present disclosure, the processor may determine the plurality of delay times through a training based on the data strobe signal and the latched data.

According to various embodiments of the present disclosure, the processor may set the plurality of delay times arbitrarily; generate the plurality of latch triggers based on the plurality of delay times and the data strobe signal input from an external electronic device by transmitting a read request to the external electronic device; obtain the plurality of latched data by latching the data line based on the plurality of latch triggers; determine the plurality of delay times as a final set value when all of the plurality of latched data have a same value; and generate the plurality of latch triggers after changing the plurality of delay times when all the plurality of latched data do not have a same value; and repeat to train the obtaining the plurality of latched data until all the plurality latched data have the same value.

According to various embodiments of the present disclosure, the processor may change the plurality of delay times by adding a same amount of time to a current value of each of the plurality of delay times, or change the plurality of delay times such that time gaps between the plurality of delay times become equal and become reduced than before, when a largest delay time after adding the same amount of time to the current value of each of the plurality of delay times is larger than a time for which the data strobe signal is maintained to be in a low or a high level.

According to various embodiments of the present disclosure, the processor may perform the training for determining the plurality of delay times at a regular time interval, or perform the training for determining the plurality of delay times whenever power is supplied to the electronic apparatus, or perform the training for determining the plurality of delay times when a difference between a temperature at which the plurality of delay times has been previously determined and a current temperature is equal to or more than a preset value, or perform the training for determining the plurality of delay times when values of all the plurality of latched data are not the same during determination of the reception data.

According to various embodiments of the present disclosure, when receiving data from a plurality of external electronic devices, the processor may set a plurality of delay times that are different from one another with respect to each of the plurality of external electronic devices, and when receiving data from one among the plurality of external electronic devices, the processor may provide data of a plurality of delay times corresponding to the external electronic devices to the latch trigger generator.

Another embodiment is a storage device, including: a memory having at least one die; and a memory controller configured to perform control for reading data from the memory, set a plurality of delay times for the at least one die, generate a plurality of latch triggers based on the plurality of delay times and a data strobe signal input from the memory when reading data, generate a plurality of latched data by latching a data line connected to the at least one die based on the plurality of latch triggers, and determine reception data based on the plurality of latched data.

According to various embodiments of the present disclosure, the memory controller may generate the plurality of latch triggers at a time point when the plurality of delay times elapse from a time point when the data strobe signal is changed from a low to a high level, or from a high to a low level, and latch the data line at a time point when the plurality of latch triggers are generated.

According to various embodiments of the present disclosure, the memory controller may determine a value having a highest frequency from among values of the plurality of latched data as the reception data.

According to various embodiments of the present disclosure, the memory controller may determine a plurality of delay times to set for the at least one die through a training based on the data strobe signal and the latched data.

According to various embodiments of the present disclosure, the memory controller may set the plurality of delay times arbitrarily; generate the plurality of latch triggers based on the plurality of delay times and the data strobe signal input from the at least one die by transmitting a read request to the memory; obtain the plurality of latched data by latching the data line based on the plurality of latch triggers; determine the plurality of delay times as a final set value when all the plurality of latched data have a same value; and generate the plurality of latch triggers after changing the plurality of delay times when all the plurality of latched data do not have a same value; and repeat to train the obtaining the plurality of latched data until all the plurality latched data have a same value.

According to various embodiments of the present disclosure, the memory controller may change the plurality of delay times by adding a same amount of time to a current value of each of the plurality of delay times, or change the plurality of delay times such that time gaps between the plurality of delay times become equal and become reduced than before, when a greatest delay time after adding the same amount of time to the current value of each of the plurality of delay times is greater than a time for which the data strobe signal is maintained to be in a low or a high level.

According to various embodiments of the present disclosure, the memory controller may perform the training for determining the plurality of delay times at a regular time interval, or perform the training for determining the plurality of delay times whenever power is supplied to the storage device, or perform the training for determining the plurality of delay times when a difference between a temperature at which the plurality of delay times has been previously determined and a current temperature is equal to or more than a preset value, or perform the training for determining the plurality of delay times when all values of the plurality of latched data are not the same during determination of the reception data.

According to various embodiments of the present disclosure, when the memory has a plurality of dies, the memory controller may set a plurality of delay times that are different from one another with respect to each of the plurality of dies, and when receiving data from one among the plurality of dies, the memory controller may generate the plurality of latch triggers using a plurality of delay times corresponding to the dies.

Still another embodiment is an electronic apparatus, including: at least one second entity; and a first entity configured to transmit or receive data together with the at least one second entity, and the first entity may be configured to perform control for reading data from the at least one second entity, set a plurality of delay times for the at least one second entity, generate a plurality of latch triggers based on the plurality of delay times and a data strobe signal input from the at least one second entity when reading data, generate a plurality of latched data by latching a data line connected to the at least one second entity based on the plurality of latch triggers, and determine reception data based on the plurality of latched data.

According to various embodiments of the present disclosure, the second entity may be provided in plurality, and the first entity may set a plurality of delay times which are different from one another with respect to each of the plurality of second entities, and when receiving data from one among the plurality of second entities, the first entity may generate the plurality of latch triggers using a plurality of delay times corresponding to the second entities.

According to various embodiments of the present disclosure, in order to transmit data to the at least one second entity, the first entity may transmit data through the data strobe signal and the data line after being synchronized to the data strobe signal, and the second entity may generate a plurality of latch triggers based on the data strobe signal input from the first entity and a plurality of preset delay times with respect to the first entity; generate a plurality of latched data by latching a data line connected to the first entity based on the plurality of latch triggers; and determine reception data based on the plurality of latched data.

What is claimed is:

1. An electronic apparatus, comprising:

a latch trigger generator configured to generate a plurality of latch triggers based on a data strobe signal and a plurality of delay times;

a data latch unit configured to latch a plurality of data lines based on the plurality of latch triggers to generate a plurality of latched data for each of the plurality of data lines; and a processor configured to set the plurality of delay times and determine reception data based on the plurality of latched data, wherein the processor is configured to determine a data bit value of the data line based on the plurality of latched data.

2. The electronic apparatus of claim 1, wherein the latch trigger generator generates the plurality of latch triggers at time points, corresponding to the plurality of delay times, elapsed from a time point when the data strobe signal is changed from a low to a high level, or from a high to a low level, and wherein the data latch unit latches the data line at time points when the plurality of latch triggers are generated.

3. The electronic apparatus of claim 1, wherein the processor is configured to determine a value having a highest frequency from among values of the plurality of latched data as the data bit value, and determine the reception data based on the data bit values determined for each of the plurality of data lines.

4. The electronic apparatus of claim 1, wherein the processor is configured to determine the plurality of delay times through a training based on the data strobe signal and the latched data.

5. The electronic apparatus of claim 4, wherein the processor is configured to:

set a first plurality of delay times arbitrarily;

generate a first plurality of latch triggers based on the first plurality of delay times and the data strobe signal from an external electronic device by transmitting a read request to the external electronic device;

obtain a first plurality of latched data by latching the data line based on the first plurality of latch triggers;

determine the first plurality of delay times as a final set value of the plurality of delay times when all the first plurality of latched data have a same value; and repeat, when all the first plurality of latched data do not have a same value, changing the first plurality of delay times, generating the first plurality of latch triggers and obtaining the first plurality of latched data until all the first plurality latched data have the same value.

6. The electronic apparatus of claim 5, wherein the processor is configured to:

change the first plurality of delay times by adding a same amount of time to the first plurality of delay times, or change, when a largest delay time after adding the same amount of time to the first plurality of delay times is larger than a time for which the data strobe signal is maintained to be in a low or a high level, the first plurality of delay times to reduce and to equalize time gaps among the first plurality of delay times.

7. The electronic apparatus of claim 4, wherein the processor is configured to:

perform the training for determining the plurality of delay times at a regular time interval, or perform the training for determining the plurality of delay times whenever power is supplied to the electronic apparatus, or perform the training for determining the plurality of delay times when a difference between a temperature at which the plurality of delay times has been previously determined and a current temperature is equal to or more than a preset value, or perform the training for determining the plurality of delay times when values of all the plurality of latched data are not the same during determination of the reception data.

8. The electronic apparatus of claim 1, wherein when receiving data from a plurality of external electronic devices, the processor is configured to set a plurality of delay times that are different from one another with respect to each of the plurality of external electronic devices, and wherein when receiving data from one among the plurality of external electronic devices, the processor is configured to provide a plurality of delay times corresponding to the external electronic devices to the latch trigger generator.

9. A storage device, comprising:

a memory having at least one die; and a memory controller configured to:

set a plurality of delay times for the at least one die, generate a plurality of latch triggers based on the plurality of delay times and a data strobe signal from the memory when reading subsequent data, generate a plurality of latched data by latching data lines connected to the at least one die based on the plurality of latch triggers, and determine reception data based on the plurality of latched data, wherein the plurality of delay times are set for respective data lines connected to the at least one die based on reception data previously obtained.

10. The storage device of claim 9, wherein the memory controller is configured to:

generate the plurality of latch triggers at time points when the plurality of delay times elapse from a time point when the data strobe signal is changed from a low to a high level, or from a high to a low level, and latch the data line at time points when the plurality of latch triggers are generated.

11. The storage device of claim 9, wherein the memory controller is configured to determine a value having a highest frequency from among values of the plurality of latched data a data bit value, and determine the reception data based on the data bit values determined for each of the plurality of data lines.

12. The storage device of claim 9, wherein the memory controller is configured to determine the plurality of delay times for the at least one die through a training based on the data strobe signal and the latched data.

13. The storage device of claim 12, wherein the memory controller is configured to:

set a first plurality of delay times arbitrarily;

generate a first plurality of latch triggers based on the first plurality of delay times and the data strobe signal from the at least one die by transmitting a read request to the memory;

obtain a first plurality of latched data by latching the data line based on the first plurality of latch triggers;

determine the first plurality of delay times as a final set value of the plurality of delay times when all the first plurality of latched data have a same value; and repeat, when all the first plurality of latched data do not have a same value, changing the first plurality of delay times, generating the first plurality of latch triggers and obtaining the first plurality of latched data until all the first plurality latched data have the same value.

14. The storage device of claim 13, wherein the memory controller is configured to:

change the first plurality of delay times by adding a same amount of time to the first plurality of delay times, or change, when a greatest delay time after adding the same amount of time to the first plurality of delay times is greater than a time for which the data strobe signal is maintained to be in a low or a high level, the first plurality of delay times such that time gaps between the first plurality of delay times are reduced and equalized.

15. The storage device of claim 12, wherein the memory controller is configured to:

perform the training for determining the plurality of delay times at a regular time interval, or perform the training for determining the plurality of delay times whenever power is supplied to the storage device, or perform the training for determining the plurality of delay times when a difference between a temperature at which the plurality of delay times has been previously determined and a current temperature is equal to or more than a preset value, or perform the training for determining the plurality of delay times when all values of the plurality of latched data are not the same during determination of the reception data.

16. The storage device of claim 9, wherein when the memory has a plurality of dies, the memory controller is configured to set a plurality of delay times that are different from one another with respect to each of the plurality of dies, and wherein when receiving data from one among the plurality of dies, the memory controller is configured to generate the plurality of latch triggers using the plurality of delay times corresponding to the dies.

* * * * *